(12) United States Patent
McNamara

(10) Patent No.: US 7,579,689 B2
(45) Date of Patent: Aug. 25, 2009

(54) INTEGRATED CIRCUIT PACKAGE, AND A METHOD FOR PRODUCING AN INTEGRATED CIRCUIT PACKAGE HAVING TWO DIES WITH INPUT AND OUTPUT TERMINALS OF INTEGRATED CIRCUITS OF THE DIES DIRECTLY ADDRESSABLE FOR TESTING OF THE PACKAGE

(75) Inventor: Noel A. McNamara, Limerick County (IE)

(73) Assignee: Mediatek Inc., Hsin-Chu (TW)

( * ) Notice: Subject to any disclaimer, the term of this patent is extended or adjusted under 35 U.S.C. 154(b) by 82 days.

(21) Appl. No.: 11/344,372

(22) Filed: Jan. 31, 2006

(65) Prior Publication Data

US 2007/0176632 A1   Aug. 2, 2007

(51) Int. Cl.
*H01L 23/34* (2006.01)
*H01L 23/58* (2006.01)

(52) U.S. Cl. .................. 257/723; 257/48; 257/107; 257/150; 257/E29.001; 438/14; 438/110; 438/133; 324/415; 324/418

(58) Field of Classification Search .............. 257/723, 257/743, 685, 686, 726, E25.031–E25.032, 257/E23.042, E25.005, E25.006, E25.021, 257/E25.027, 773–786; 438/109, FOR. 368, 438/FOR. 426; 361/819, 820, 828
See application file for complete search history.

(56) References Cited

U.S. PATENT DOCUMENTS 4,703,436 A * 10/1987 Varshney ................. 716/4

| | | | |
|---|---|---|---|
| 6,721,913 B1 | 4/2004 | Azimi | |
| 6,825,683 B1 | 11/2004 | Berndt et al. | |
| 7,091,588 B2 * | 8/2006 | Akiyama et al. | 257/685 |
| 7,109,582 B2 * | 9/2006 | Matsuoka | 257/724 |
| 7,229,858 B2 * | 6/2007 | Kutsuna | 438/133 |
| 2002/0175348 A1 | 11/2002 | Stadler | |
| 2005/0280434 A1 | 12/2005 | Whetsel | |

OTHER PUBLICATIONS

PCT Search Report, PCT/IE2007/000003, Jun. 6, 2007.

* cited by examiner

Primary Examiner—Jasmine J Clark
(74) Attorney, Agent, or Firm—Winston Hsu

(57) ABSTRACT

An integrated circuit package (1) comprising first and second dies on a laminate (5) in a resin encapsulating housing (6) comprises a digital signal processing integrated circuit (8) fabricated on the first die (2), and a digital-to-analogue converting circuit (9) fabricated on the second die (3). First external terminals (16) are selectively coupled to corresponding first input terminals (10) of the digital signal processing circuit (8) through corresponding primary input switches (19), and first output terminals (11) of the digital signal processing circuit (8) are selectively coupled through primary output switches (23) and secondary input switches (25) to second input terminals (12) of the digital-to-analogue converting circuit (9). Second output terminals (13) of the digital-to-analogue converting circuit (9) are selectively coupled to second external terminals (17) through secondary output switches (30). The switches (19,23,25,30) are configurable for selectively testing functions of the digital signal processing circuit (8) and the digital-to-analogue converting circuit (9) between selectable combinations of first input and output terminals (10,11) and second input and output terminals (12, 13) by applying a test signal to an appropriate one of the first external terminals (16), and reading a response signal on an appropriate second external terminal (17).

29 Claims, 6 Drawing Sheets

INTEGRATED CIRCUIT PACKAGE, AND A METHOD FOR PRODUCING AN INTEGRATED CIRCUIT PACKAGE HAVING TWO DIES WITH INPUT AND OUTPUT TERMINALS OF INTEGRATED CIRCUITS OF THE DIES DIRECTLY ADDRESSABLE FOR TESTING OF THE PACKAGE

FIELD OF THE INVENTION

The present invention relates to an integrated circuit package, and in particular, to an integrated circuit package comprising two interconnected dies each having input and output terminals which are directly addressable, and the invention also relates to a method for producing an integrated circuit package having two dies with input and output terminals of integrated circuits of the dies directly addressable for testing of the integrated circuit package.

BACKGROUND TO THE INVENTION

Integrated circuit packages which comprise more than a single integrated circuit die are known. For example, such integrated circuit packages may comprise two dies each comprising one or more integrated circuits, and the dies are interconnected internally in the package. For example, one die may comprise a digital signal processing integrated circuit, while the other die may comprise an analogue integrated circuit such as a digital-to-analogue converting circuit. Ideally, the number of pin connectors or other such external connectors or terminals of the package should be minimised. Thus, in general, such packages are provided with an appropriate number of input pin connectors for applying digital data to the digital signal processing circuit die, and one or more output pin connectors are provided for outputting analogue signals from the analogue circuit die. In general, the dies are provided with input and output bond pads, the number of input pin connectors to the digital signal processing circuit die corresponding to the number of input bond pads, and the input bond pads are coupled by bond wires to the corresponding input pin connectors. The number of output pin connectors from the analogue circuit die corresponding to the number of output bond pads, and the output bond pads are coupled by bond wires to the corresponding output pin connectors. Output bond pads from the digital signal processing circuit die are coupled to corresponding input bond pads of the analogue circuit die by bond wires, which are located internally within the package.

While the pin count is minimised in such two-die integrated circuit packages, unfortunately, testing of such dies can be problematical, due to the lack of externally accessible input and output pin connectors to the two dies, and in particular, due to the lack of externally accessible pin connectors coupled to output bond pads from the digital signal processing circuit die, and the lack of externally accessible pin connectors coupled to input bond pads to the analogue circuit die. This leads to considerable difficulty in testing such two-die integrated circuit packages.

There is therefore a need for an integrated circuit package which lends itself more readily to testing.

The present invention is directed towards providing such an integrated circuit package, and the invention is also directed towards a method for producing an integrated circuit package having two dies with input and output terminals of integrated circuits of the dies being directly addressable for testing of the integrated circuit package.

SUMMARY OF THE INVENTION

According to the invention there is provided an integrated circuit package comprising:
   a first die having a first integrated circuit thereon, and a first input terminal to and a first output terminal from the first integrated circuit,
   a second die having a second integrated circuit thereon, and a second input terminal to and a second output terminal from the second integrated circuit,
   a first external terminal accessible externally of the integrated circuit package,
   a second external terminal accessible externally of the integrated circuit package, and
   a switch circuit operable for selectively coupling the first input terminal to the first external terminal, the second output terminal to the second external terminal, and the second input terminal to the first output terminal for normal operation of the integrated circuit package, the switch circuit being operable for facilitating selective testing of the first and second integrated circuits, so that a test signal applied to the first external terminal is relayed to the one of the first and second input terminals of the selected one of the first and second integrated circuits, and a response signal to the test signal on the one of the first and second output terminals of the selected one of the first and second integrated circuits is relayed to the second external terminal.

In one aspect of the invention the switch circuit is operable for selectively coupling the first external terminal to a selected one of the first input terminal and the second input terminal, and for selectively coupling the second external terminal to a selected one of the first output terminal and the second output terminal. Preferably, the switch circuit is operable for selectively coupling the first external terminal to the first output terminal. Advantageously, the switch circuit is operable for selectively coupling the second external terminal to a selected one of the first and second output terminals and the second input terminal.

In another aspect of the invention a plurality of first output terminals are provided from the first integrated circuit, and a plurality of second input terminals are provided to the second integrated circuit, the switch circuit being operable for selectively coupling the second input terminals to respective corresponding ones of the first output terminals for normal operation of the integrated circuit package. Preferably, the switch circuit is operable for selectively coupling the first external terminal to a selected one of selectable ones of at least some of the second input terminals. Advantageously, the switch circuit is operable for selectively coupling the first external terminal to a selected one of selectable ones of at least some of the first output terminals. Ideally, the switch circuit is operable for selectively coupling the second external terminal to a selected one of selectable ones of at least some of the first output terminals.

In another aspect of the invention a plurality of first input terminals are provided to the first integrated circuit, and the switch circuit is operable for selectively coupling the first external terminal to a selected one of selectable ones of at least some of the first input terminals.

In a further aspect of the invention a plurality of externally accessible first external terminals are provided, at least some of the first external terminals corresponding to respective ones of the first input terminals, and the switch circuit is operable for selectively coupling the first external terminals to the corresponding first input terminals for normal operation of the integrated circuit package.

In a still further aspect of the invention at least one of the first external terminals corresponds to a plurality of the first input terminals, and the switch circuit is operable for selectively coupling a selected one of selectable ones of the plurality of first input terminals corresponding to the at least one of the first external terminals to the corresponding first external terminal.

Advantageously, a plurality of second output terminals are provided from the second integrated circuit, and the switch circuit is operable for selectively coupling the second external terminal to a selected one of selectable ones of the second output terminals. Preferably, a plurality of externally accessible second external terminals are provided, at least some of the second external terminals corresponding to respective ones of the second output terminals, and the switch circuit is operable for selectively coupling the second external terminals to the corresponding second output terminals for normal operation of the integrated circuit package.

In one aspect of the invention at least one intermediate die is provided, the intermediate die having an integrated circuit thereon and an input terminal to and an output terminal from the integrated circuit, the switch circuit being operable for selectively coupling the second input terminal of the second integrated circuit of the second die to the first output terminal of the first integrated circuit of the first die through the integrated circuit of the at least one intermediate die for normal operation of the integrated circuit package, and the switch circuit being operable for facilitating selective testing of the integrated circuit of the intermediate die, so that a test signal applied to the first external terminal is relayed to the input terminal of the integrated circuit of the intermediate die and a response signal to the test signal on the output terminal of the integrated circuit of the intermediate die is relayed to the second external terminal.

In another aspect of the invention a plurality of intermediate dies is provided, each intermediate die having an integrated circuit thereon and an input terminal to and an output terminal from the integrated circuit, the switch circuit being operable for selectively coupling the second input terminal of the second integrated circuit of the second die to the first output terminal of the first integrated circuit of the first die through the integrated circuits of at least some of the intermediate dies for normal operation of the integrated circuit package, and the switch circuit being operable for selectively testing the integrated circuit of a selected one of the intermediate dies, so that a test signal applied to the first external terminal is relayed to the input terminal of the integrated circuit of the selected intermediate die, and a response signal to the test signal on the output terminal of the integrated circuit of the selected intermediate die is relayed to the second external terminal.

Preferably, a first input bond pad corresponding to each first external terminal is provided on the first die, each first input bond pad being coupled to the corresponding first external terminal, and being selectively coupleable to a selected one of selectable ones of the corresponding one or ones of the first input terminals, the corresponding one or ones of the first output terminals and the corresponding one or ones of the second input terminals by the switch circuit. Advantageously, a first output bond pad corresponding to each first output terminal is provided on the first die, each first output bond pad being selectively coupleable to a selected one of the corresponding first output terminal and the corresponding first input bond pad by the switch circuit.

In another aspect of the invention a second input bond pad corresponding to each second input terminal is provided on the second die, each second input bond pad being coupled to the corresponding first output bond pad, and being selectively coupleable to a selected one of the corresponding second input terminal and the second external terminal by the switch circuit. Preferably, a second output bond pad corresponding to each second external terminal is provided on the second die, each second output bond pad being coupled to the corresponding second external terminal, and being selectively coupleable to a selected one of the corresponding second output terminal and the second input bond pad by the switch circuit.

In another aspect of the invention the switch circuit comprises a first switch circuit and a second switch circuit, the first switch circuit being implemented as a first integrated switch circuit on the first die, and the second switch circuit being implemented as a second integrated switch circuit on the second die. Preferably, the switch circuit comprises an intermediate switch circuit implemented as an integrated circuit on each intermediate die. Advantageously, a control circuit responsive to an externally generated signal applied thereto is provided for selectively operating the switch circuit. Preferably, the control circuit is implemented as an integrated circuit on at least one of the first and second dies.

In one aspect of the invention the first and second dies are mounted on a support and encapsulated with the support, the first and second external terminals extending out of the encapsulation.

The invention also provides an integrated circuit package comprising:
   a first die having a first integrated circuit thereon, and at least one first input terminal to and a plurality of first output terminals from the first integrated circuit,
   a second die having a second integrated circuit thereon and a plurality of second input terminals to and at least one second output terminal from the second integrated circuit,
   at least one first external terminal accessible externally of the integrated circuit package,
   at least one second external terminal accessible externally of the integrated circuit package, and
   a switch circuit operable for selectively coupling the or each first external terminal to the one or a corresponding one of the first input terminals, the or each second external terminal to the one or a corresponding one of the second output terminals, and each second input terminal to a corresponding one of the first output terminals for normal operation of the integrated circuit package, the switch circuit being operable for facilitating selective testing of the first and second integrated circuits between selectable combinations of the first input terminal or terminals and the first output terminals and selectable combinations of the second input terminals and the second output terminal or terminals, so that a test signal applied to the one or one of the first external terminals is relayed to a selected one of the first and second input terminals of the selected one of the first and second integrated circuits, and a response signal to the test signal on a selected one of the first and second output terminals of the selected one of the first and second integrated circuits is relayed to the one or one of the second external terminals.

In one aspect of the invention at least one intermediate die is provided, the intermediate die having an integrated circuit thereon and a plurality of input terminals to and at least one output terminal from the integrated circuit, the switch circuit being operable for selectively coupling the second input terminal of the second integrated circuit of the second die to the first output terminal of the first integrated circuit of the first die through the integrated circuit of the at least one intermediate die for normal operation of the integrated circuit package, and the switch circuit being operable for facilitating selective testing of the integrated circuit of one of the at least one intermediate die between selectable combinations of the input and output terminals of the integrated circuit of the selected one of the at least one of the intermediate die so that a test signal applied to one or one of the first external terminals is relayed to a selected one of the input terminals of the integrated circuit of the selected intermediate die, and a response signal to the test signal on the output terminal or the selected one of the output terminals of the integrated circuit of the selected intermediate die is relayed to the second external terminal.

Additionally, the invention provides a method for producing an integrated circuit package comprising two dies with respective integrated circuits formed thereon, and with input and output terminals of the integrated circuits being directly addressable for facilitating testing of the integrated circuits, the method comprising:

providing a first die of the two dies, the first die having a first integrated circuit thereon with a first input terminal to and a first output terminal from the first integrated circuit, providing a second die of the two dies, the second die having a second integrated circuit thereon with a second input terminal to and a second output terminal from the second integrated circuit, providing a first external terminal accessible externally of the integrated circuit package, providing a second external terminal accessible externally of the integrated circuit package, and providing a switch circuit operable for selectively coupling the first input terminal to the first external terminal, the second output terminal to the second external terminal, and the second input terminal to the first output terminal for normal operation of the integrated circuit package, the switch circuit being operable for facilitating selective testing of the first and second integrated circuits, so that a test signal applied to the first external terminal is relayed to the one of the first and second input terminals of the selected one of the first and second integrated circuits, and a response signal to the test signal on the one of the first and second output terminals of the selected one of the first and second integrated circuits is relayed to the second external terminal.

Further the invention provides a method for producing an integrated circuit package comprising two dies with respective integrated circuits formed thereon, and with input and output terminals of the integrated circuits being directly addressable for facilitating testing of the integrated circuits, the method comprising:

providing a first die of the two dies, the first die having a first integrated circuit thereon with at least one first input terminal to and a plurality of first output terminals from the first integrated circuit, providing a second die having a second integrated circuit thereon with a plurality of second input terminals to and at least one second output terminal from the second integrated circuit, providing at least one first external terminal accessible externally of the integrated circuit package, providing at least one second external terminal accessible externally of the integrated circuit package, and providing a switch circuit operable for selectively coupling the or each first external terminal to the one or to a corresponding one of the first input terminals, the or each second external terminal to the one or a corresponding one of the second output terminals, and each second input terminal to a corresponding one of the first output terminals for normal operation of the integrated circuit package, the switch circuit being operable for facilitating selective testing of the first and second integrated circuits between selectable combinations of the first input terminal or terminals and the first output terminals and selectable combinations of the second input terminals and the second output terminal or terminals, so that a test signal applied to the one or one of the first external terminals is relayed to a selected one of the first and second input terminals of the selected one of the first and second integrated circuits, and a response signal to the test signal on a selected one of the first and second output terminals of the selected one of the first and second integrated circuits is relayed to the second external terminal or to one of the second external terminals.

ADVANTAGES OF THE INVENTION

The advantages of the invention are many. A particularly important advantage of the invention is that it provides an integrated circuit package which comprises two or more dies, and integrated circuits on the respective dies can be thoroughly tested with the minimum number of additional external terminals. This is achieved by virtue of the fact that the switch circuit is operable for selectively coupling input and output terminals of the integrated circuits of the dies, which would not normally be addressable, directly to the first and second external terminals, so that a test signal applied to one of the first external terminals is applied directly to a selected one of the input terminals of the integrated circuits of the respective dies, and a response signal on a selected one of the output terminals of the integrated circuits of the respective dies can be read directly from one of the second external terminals. Indeed, where the integrated circuit package is provided with a first die and a second die, no additional external terminals are required for testing the integrated circuit package, apart from external control terminals for receiving externally generated control signals for controlling the operation of the switch circuit during testing. Similarly, when the package is provided with one or more intermediate dies, the only additional external terminals required for facilitating testing of the integrated circuit package are those for receiving externally generated control signals for controlling the operation of the switch circuit during testing. Another advantage of the invention is that it permits individual functions of respective integrated circuits of the respective dies to be individually tested with the minimum number of additional external terminals.

The invention and its many advantages will be more clearly understood from the following description of some preferred embodiments thereof, which are given by way of example only, with reference to the accompanying drawings.

DETAILED DESCRIPTION OF THE INVENTION

Figure 1:
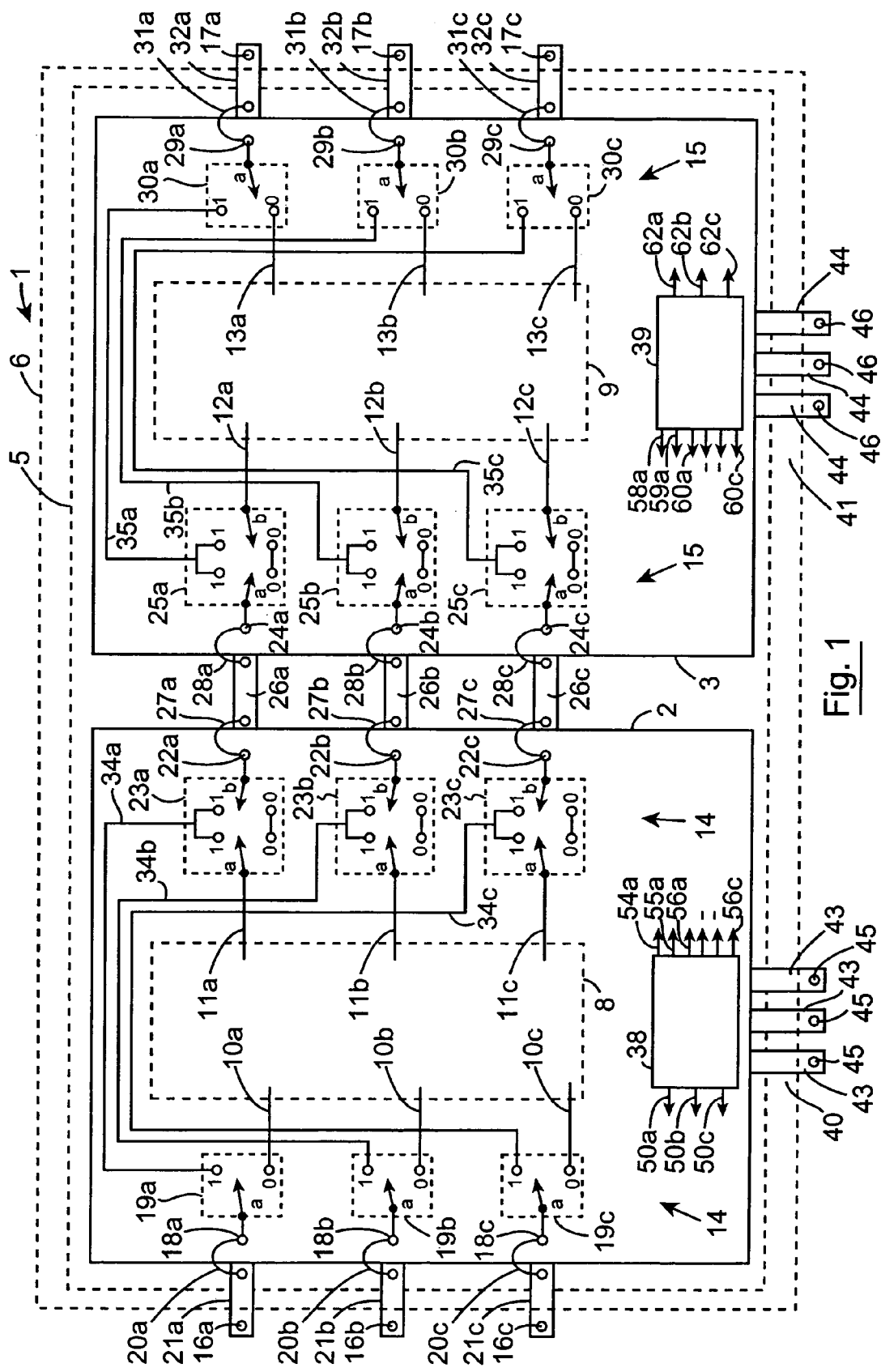
FIG. 1 is a block representation of an integrated circuit package according to the invention.

Referring to the drawings and initially to FIGS. 1 to 5, there is illustrated an integrated circuit package according to the invention, indicated generally by the reference numeral 1, which can be readily easily tested. The integrated circuit package 1 comprises two dies, namely, a first die 2 and a second die 3, both of which are mounted on a support, which in this case is a laminate 5, and the first and second dies 2 and 3 are encapsulated together with the laminate 5 in a resin encapsulating housing 6. The resin encapsulating housing 6 is represented by broken lines only. The laminate 5, which is effectively a miniature printed circuit board is also represented in broken lines only. Such laminates 5 in the form of miniature printed circuit boards will be well known to those skilled in the art. However, it will be appreciated that the first and second dies 2 and 3 could be mounted on any other suitable support instead of a laminate, for example, a lead frame. The first die 2 comprises a first integrated circuit, which in this embodiment of the invention is a digital signal processing circuit 8. The second die 3 comprises a second integrated circuit, which in this embodiment of the invention is an analogue integrated circuit, namely, a digital-to-analogue converting circuit 9. The digital signal processing circuit 8 and the digital-to-analogue converting circuit 9 are represented by broken lines on the first and second dies 2 and 3, respectively.

The digital signal processing circuit 8 comprises a plurality of first input terminals 10 for receiving digital signals from an external source, however, for convenience only three of the first input terminals 10 are illustrated, and are indicated by the reference numerals 10a, 10b and 10c. A plurality of first output terminals 11 extend from the digital signal processing circuit 8 for outputting digital signals therefrom, however, for convenience only three of the first output terminals 11 are illustrated and are indicated by the reference numerals 11a, 11b and 11c. A plurality of second input terminals 12 are provided to the digital-to-analogue converting circuit 9, the number of which corresponds to the number of first output terminals 11 from the digital signal processing circuit 8. However, for convenience only three second input terminals 12a, 12b and 12c are illustrated. A plurality of second output terminals 13 are provided from the digital-to-analogue converting circuit 9, however, for convenience in this case only three of the second output terminals 13a, 13b and 13c are illustrated.

A switch circuit comprising a first integrated switch circuit 14 formed on the first die 2 and a second integrated switch circuit 15 formed on the second die 3, both of which will be described in detail below, is operable for selectively coupling the first input terminals 10 to corresponding externally accessible first external terminals 16, the first output terminals 11 to the corresponding second input terminals 12, and the second output terminals 13 to corresponding externally accessible second external terminals 17 for normal operation of the integrated circuit package 1. The first external terminals 16 are formed by hemispherical solder contacts on an exposed underside of the laminate 5 for receiving digital input signals, and the second external terminals 17 are also formed by hemispherical solder contacts on the exposed underside of the laminate 5 for outputting analogue output signals from the integrated circuit package 1 in response to the digital input signals applied to the first external terminals 16. Although only three first external terminals 16 are illustrated and indicated by the reference numerals 16a to 16c, in general, the number of first external terminals 16 will correspond to the number of first input terminals 10. Similarly, although only three second external terminals 17 have been illustrated and indicated by the reference numerals 17a, 17b and 17c, in general, the number of second external terminals 17 will correspond to the number of second output terminals 13. Indeed, in many cases it is envisaged that the digital-to-analogue converting circuit 9 may be provided with a single second output terminal 13 only, and thus, only a single second external terminal 17 would be provided, as in the embodiment of the invention which is described below with reference to FIGS. 8 and 9. The first and second external terminals 16 and 17 are suitable for coupling to corresponding terminals of tracks on a conventional printed circuit board for receiving digital signals from other digital devices on the printed circuit board or for delivering analogue signals to other devices on the printed circuit board.

The first and second switch circuits 14 and 15 are also operable for facilitating selective testing of the digital signal processing circuit 8 and the digital-to-analogue converting circuit 9 between selectable combinations of the first input and output terminals 10 and 11 and selectable combinations of the second input and output terminals 12 and 13, so that a test signal applied to one of the first external terminals 16 is relayed to one of the corresponding first and second input terminals 10 and 12 of the selected one of the digital signal processing circuit 8 and the digital-to-analogue converting circuit 9 under test, and a response signal to the test signal on a selected one of the first and second output terminals 11 and 13 of the selected one of the digital signal processing circuit 8 and the digital-to-analogue converting circuit 9 under test is relayed to a corresponding one of the second external terminals 17. The operation of the first and second switch circuits 14 and 15 during testing of the digital signal processing circuit 8 and the digital-to-analogue converting circuit 9 is described in detail below.

Each first input terminal 10 is coupled to a corresponding first input bond pad 18 on the first die 2 through a corresponding primary input switch 19 of the first switch circuit 14. The first input bond pads 18 and the primary input switches 19 corresponding to the first input terminals 10a, 10b and 10c are indicated by the reference numerals 18a, 18b and 18c, and 19a, 19b and 19c, respectively. Bond wires 20a, 20b and 20c couple the first input bond pads 18a, 18b and 18c to corresponding input tracks 21a, 21b and 21c on the laminate 5, which in turn terminate in the corresponding first external terminals 16a, 16b and 16c. The first output terminals 11a, 11b and 11c are coupled to corresponding first output bond pads 22a, 22b and 22c on the first die 2 through corresponding primary output switches 23a, 23b and 23c of the first switch circuit 14.

Each second input terminal 12a, 12b and 12c is coupled to a corresponding second input bond pad 24a, 24b and 24c on the second die 3 through a corresponding secondary input switch 25a, 25b and 25c of the second switch circuit 15. Intermediate tracks 26 on the laminate 5 couple corresponding ones of the first output bond pads 22 and the second input bond pads 24 through corresponding bond wires 27 and 28. The intermediate tracks 26 and the bond wires 27 and 28 corresponding to the first output bond pads 22a, 22b and 22c, and the second input bond pads 24a, 24b and 24c, respectively, are indicated by the reference numerals 26a, 26b and 26c, and 27a, 27b and 27c, and 28a, 28b and 28c, respectively. In certain cases the corresponding first output bond pads 22 and the second input bond pads 24 could be coupled directly to each other by corresponding bond wires, thus avoiding the need for the intermediate tracks 26, and indeed, if the dies were stacked one above the other on the laminate 5, instead of being placed side by side on the laminate 5, the first output bond pads 22 and the second input bond pads 24 would normally be coupled directly to each other by corresponding bond wires.

Each second output terminal 13 is coupled to a corresponding second output bond pad 29 on the second die 3 through a corresponding secondary output switch 30 of the second switch circuit 15. The second output bond pads 29 and the secondary output switches 30 corresponding to the second output terminals 13a, 13b and 13c, respectively, are indicated by the reference numerals 29a, 29b and 29c, and 30a, 30b and 30c, respectively. Bond wires 31a, 31b and 31c couple the second output bond pads 29a, 29b and 29c to corresponding output tracks 32a, 32b and 32c on the laminate 5 which terminate in the second external terminals 17a, 17b and 17c.

It will be appreciated that if the first and second dies were mounted on a lead frame, the first input bond pads 18 would be coupled by bond wires to corresponding fingers of the lead frame, which would terminate in externally accessible pin connectors, which in turn would project through the encapsulating housing 6. Similarly, the second output bond pads 29 would be coupled by bond wires to other corresponding fingers of the lead frame, which would likewise terminate in externally accessible pin connectors extending through the encapsulating housing 6.

First electrically conductive tracks 34a, 34b and 34c on the first die 2 couple the corresponding ones of the primary input and output switches 19a, 19b and 19c and 23a, 23b and 23c, respectively. Second electrically conductive tracks 35a, 35b and 35c formed on the second die 3 couple the corresponding ones of the secondary input and output switches 25a, 25b and 25c and 30a, 30b and 30c, respectively. The corresponding pair of the primary input and output switches 19a and 23a co-operate with the first electrically conductive track 34a for selectively coupling the first external terminal 16a to one of the first input terminal 10a, the first output terminal 11a and the first output bond pad 22a. Similarly, the corresponding pairs of the primary input and output switches 19b and 23b, and 19c and 23c co-operate with the first electrically conductive tracks 34b and 34c, respectively, for selectively coupling the first external terminals 16b and 16c to one of the corresponding first input terminal 10b, 10c, the corresponding first output terminal 11b, 11c and the corresponding first output bond pad 22b, 22c, respectively. The corresponding pair of the secondary input and output switches 25a and 30a co-operate with the second electrically conductive track 35a for selectively coupling the second external terminal 17a to one of the second output terminals 13a, the second input terminal 12a and the second input bond pad 24a. Similarly, the corresponding pairs of secondary input and output switches 25b and 30b, and 25c and 30c co-operate with the second electrically conductive tracks 35b and 35c, respectively, for selectively coupling the second external terminals 17b and 17c to one of the corresponding second output terminals 13b, 13c, the corresponding second input terminal 12b, 12c, and the corresponding second input bond pads 24b and 24c, respectively.

A control circuit comprising a first control circuit provided by a first integrated JTAG circuit 38 and a second control circuit provided by a second integrated JTAG circuit 39 controls operation of the first and second switch circuits 14 and 15, respectively. The first JTAG circuit 38 is fabricated on the first die 2 for controlling the operation of the primary input and output switches 19 and 23. The second JTAG circuit 39 is fabricated on the second die 3 for controlling the operation of the secondary input switches 25 and the secondary output switches 30. First and second serial data ports 40 and 41 to the first and second JTAG circuits 38 and 39, respectively, are coupled by bond wires (not shown) to first and second control tracks 43 and 44, respectively, of the corresponding laminates 5. The first and second control tracks 43 and 44 terminate in externally accessible first and second external control terminals 45 and 46, respectively, for applying logic control signals to the first and second JTAG circuits 38 and 39 for in turn controlling the operation of primary input and output switches 19 and 23 and the secondary input and output switches 25 and 30, respectively.

Before describing the integrated circuit package 1 in further detail, the operation of the primary and secondary input and output switches 19, 23, 25 and 30 will first be described. In normal operation of the integrated circuit package 1, the switch contacts a and b of the primary input switches 19, the primary output switches 23, the secondary input switches 25 and the secondary output switches 30 are switched to the contacts zero of the respective switches 19, 23, 25 and 30. In this configuration the first external terminals 16 are coupled to the corresponding first input terminals 10, the first output terminals 11 are coupled to the corresponding second input terminals 12, and the second output terminals 13 are coupled to the corresponding second external terminals 17.

When it is desired to test a function of the digital signal processing circuit 8 between the first input terminal 10a and the first output terminal 11a, the switch contact a of the primary input switch 19a is switched to the contact zero. The switch contacts a and b of the primary output switch 23a are also both switched to contact zero. The switch contact a of the secondary input switch 25a is switched to the contact one, and the switch contact b of the secondary input switch 25a is switched to the contact zero. The switch contact a of the secondary output switch 30 is coupled to the contact one. In this configuration of the switches 19a, 23a, 25a and 30a, the first external terminal 16a is coupled directly to the first input terminal 10a of the digital signal processing circuit 8, and the first output terminal 11a of the digital signal processing circuit 8 is coupled directly to the second external terminal 17a through the second electrically conductive track 35a. Additionally, in this configuration of the switches 19a, 23a, 25a and 30a, the second input terminal 12a and the second output terminal 13a of the digital-to-analogue converting circuit 9 are disconnected from the second input and output bond pads 24a and 29a, respectively, and in other words, are effectively floating. Accordingly, with the switches 19a, 23a, 25a and 30a in this configuration, a function of the digital signal processing circuit 8 between the first input and output terminals 10a and 11a is tested by applying an appropriate test signal to the first external terminal 16a and reading a response signal on the second external terminal 17a.

When it is desired to test a function in the digital-to-analogue converting circuit 9 between the second input terminal 12a and the second output terminal 13a, the switch contact a of the primary input switch 19a is switched to the contact one.

The switch contact a of the primary output switch 23a is switched to contact zero, and the switch contact b of the primary output switch 23a is switched to the contact one. The two switch contacts a and b of the secondary input switch 25a are both switched to corresponding contacts zero, and the switch contact a of the secondary output switch 30a is switched to the contact zero. In this configuration of the switches 19a, 23a, 25a and 30a, the first external terminal 16a is coupled directly to the second input terminal 12a of the digital-to-analogue converting circuit 9 through the first electrically conductive track 34a, and the second output terminal 13a is coupled directly to the second external terminal 17a. Thus, in order to test the function of the digital-to-analogue converting circuit 9 between the second input terminal 12a and the second output terminal 13a, an appropriate test signal is applied to the first external terminal 16a and a response signal is read on the second external terminal 17a.

Similarly, if it is desired to test a function of the digital signal processing circuit 8 between the first input terminal 10a and, for example, the first output terminal 11c, the primary input and output switches 19a and 23c are configured for coupling the first external terminal 16a to the first input terminal 10a, and for coupling the first output terminal 11c to the first output bond pad 22c. The secondary input and output switches 25c and 30c are configured for coupling the second input bond pad 24c directly to the second output bond pad 29c through the second electrically conductive track 35c. Accordingly, by applying an appropriate test signal to the first external terminal 16a, a response signal can be read on the second external terminal 17c for testing the function of the digital signal processing circuit 8 between the first input terminal 10a and the first output terminal 11c. It will be readily understood from the above descriptions of the operation of the first and second switch circuits 14 and 15 that by appropriately configuring the primary input and output switches 19 and 23, and the secondary input and output switches 25 and 30, functions of the digital signal processing circuit 8 and the digital-to-analogue converting circuit 9 between other selectable combinations of first input and first output terminals 10 and 11, and other selectable combinations of second input and second output terminals 12 and 13 may be similarly tested.

Figure 2:
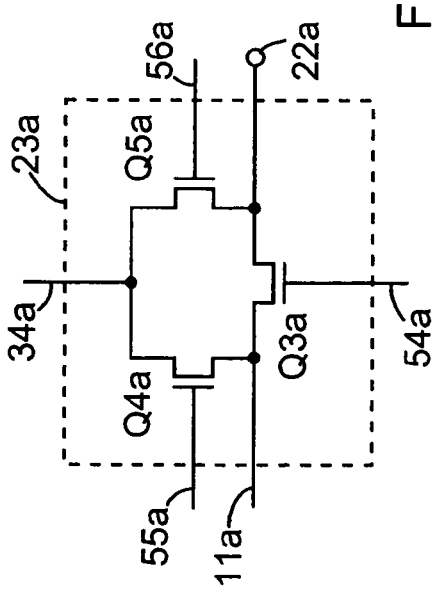
FIG. 2 is a circuit diagram of a detail of the integrated circuit package of FIG. 1.

Referring now to FIG. 2, one of the primary input switches 19, namely, the primary input switch 19a is illustrated. The primary input switch 19a comprises a first primary input transistor Q1a, and a second primary input transistor Q2a, both of which are fabricated as CMOS devices on the first die 2. The first primary input transistor Q1a couples the first input bond pad 18a to the corresponding first input terminal 10a. The second primary input transistor Q2a couples the first input bond pad 18a to the first electrically conductive track 34a. A logic control signal applied on a first primary control line 50a by the first JTAG circuit 38 controls the operation of the first and second primary input transistors Q1a and Q2a for configuring the primary input switch 19a appropriately. The logic signal on the corresponding control line 50a is applied directly to the first primary input transistor Q1a, and is applied to the second primary input transistor Q2a through an inverter 52a, so that when the first primary input transistor Q1a is operating in the low impedance state, the second primary input transistor Q2a is operating in the high impedance state and vice versa. The primary input switches 19b and 19c are similar to the primary input switch 19a, and further description should not be required. Logic control signals applied on first primary control lines 50b and 50c control the operation of corresponding first and second primary input transistors of the primary input switches 19b and 19c.

Figure 3:
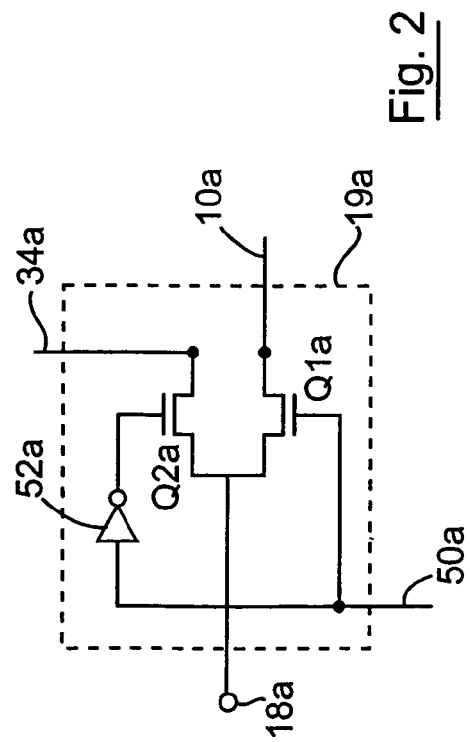
FIG. 3 is a circuit diagram of another detail of the integrated circuit package of FIG. 1.

Referring now to FIG. 3, the primary output switch 23a will now be described. The primary output switch 23a comprises three transistors, namely, a first primary output transistor Q3a, and second and third primary output transistors Q4a and Q5a, respectively. The first, second and third primary output transistors Q3a, Q4a and Q5a are fabricated as CMOS devices on the first die 2. The first primary output transistor Q3a couples the first output terminal 11a to the first output bond pad 22a. The second primary output transistor Q4a couples the first output terminal 11a to the first electrically conductive track 34a, while the third primary output transistor Q5a couples the first output bond pad 22a to the first electrically conductive track 34a. Control logic signals applied on second, third and fourth primary control lines 54a, 55a and 56a by the first JTAG circuit 38 control the operation of the first, second and third primary output transistors Q3a, Q4a and Q5a, respectively for appropriately configuring the primary output switch 23a. The primary output switches 23b and 23c are similar to the primary output switch 23a, and corresponding second, third and fourth primary control lines 54b and 54c, 55b and 55c, and 56b and 56c are provided from the first JTAG circuit 38 for operating the first, second and third primary output transistors of the primary output switches 23b and 23c, respectively.

Figure 4:
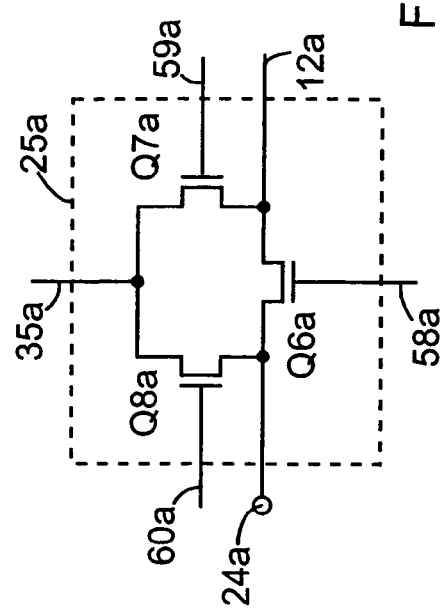
FIG. 4 is a circuit diagram of another detail of the integrated circuit package of FIG. 1.

Referring now to FIG. 4, the secondary input switch 25a is illustrated. The secondary input switch 25a comprises first, second and third secondary input transistors Q6a, Q7a and Q8a, all of which are fabricated as CMOS devices on the second die 3. The first secondary input transistor Q6a couples the second input bond pad 24a with the corresponding second input terminal 12a. The second secondary input transistor Q7a couples the second input terminal 12a with the corresponding second electrically conductive track 35a, and the third secondary input transistor Q8a couples the second input bond pad 24a with the corresponding second electrically conductive track 35a. The first, second and third secondary input transistors Q6a, Q7a and Q8a are operated under the control of the second JTAG circuit 39 by logic control signals applied to first, second and third secondary control lines 58a, 59a and 60a, respectively, for appropriately configuring the secondary input switch 25a. The secondary input switches 25b and 25c are similar to the secondary input switch 25a, the first, second and third secondary input transistors of the secondary input switches 25b and 25c are similarly controlled by logic control signals applied by the second JTAG circuit 39 on corresponding first, second and third secondary control lines 58b, 58c, 59b, 59c and 60b and 60c, respectively.

Figure 5:
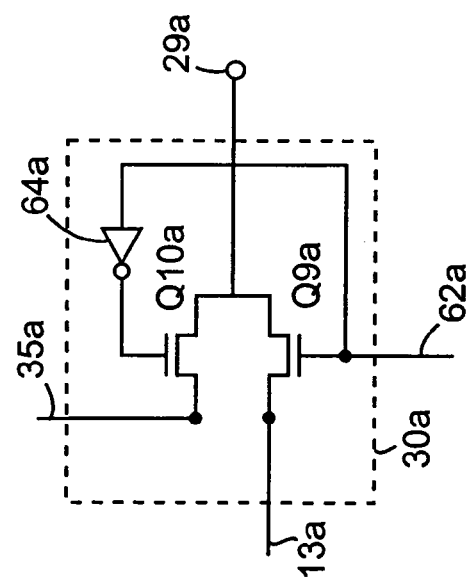
FIG. 5 is a circuit diagram of a further detail of the integrated circuit package of FIG. 1.

Referring now to FIG. 5, the secondary output switch 30a is illustrated. The secondary output switch 30a comprises a first secondary output transistor Q9a which couples the second output bond pad 29a with the second output terminal 13a and a second secondary output transistor Q10a which couples the second output bond pad 29a with the corresponding second electrically conductive track 35a. The first and second secondary output transistors Q9a and Q10a are fabricated as CMOS devices on the second die 3. The first and second secondary output transistors Q9a and Q10a are operated under the control of the second JTAG circuit 39 by logic signals applied on a fourth secondary control line 62a. An inverter 64a inverts the logic signal to the second secondary output transistor Q10 so that when the first secondary output transistor Q9a is operating in the low impedance state the second secondary output transistor Q10a is operating in the high impedance state and vice versa. The secondary output switches 30b and 30c are similar to the secondary output switch 30a, and control logic signals on corresponding fourth secondary control lines 62b and 62c from the second JTAG circuit 39 control the operation of the first and second secondary output transistors of the secondary output switches 30b and 30c, respectively.

In use, during testing of the digital signal processing circuit 8 and the digital-to-analogue converting circuit 9, the primary input and output switches 19 and 23 and the secondary input and output switches 25 and 30 are appropriately configured to carry out each test to which the digital signal processing circuit 8 and the digital-to-analogue converting circuit 9 are to be subjected, by inputting appropriate signals to the first and second JTAG circuits 38 and 39 through the first and second external control terminals 45 and 46, respectively. Each time the primary input and output switches 19 and 23 and the secondary input and output switches 25 and 30 have been appropriately configured, an appropriate test signal is applied to one or more of the first external terminals 16, and one or more corresponding response signals are read on the appropriate one or more second external terminals 17. On completion of testing, appropriate signals are entered through the first and second external control terminals 45 and 46 to the first and second JTAG circuits 38 and 39 for setting the primary input and output switches 19 and 23 and the secondary input and output switches 25 and 30 for normal operation, with the first primary input transistors Q1, the first primary output transistors Q3, the first secondary input transistors Q6 and the first secondary output transistors Q9 in the low impedance state, and the second primary input transistors Q2, the second and third primary output transistors Q4 and Q5, the second and third secondary input transistors Q7 and Q8 and the second secondary output transistor Q10 all in the high impedance state.

Figure 6:
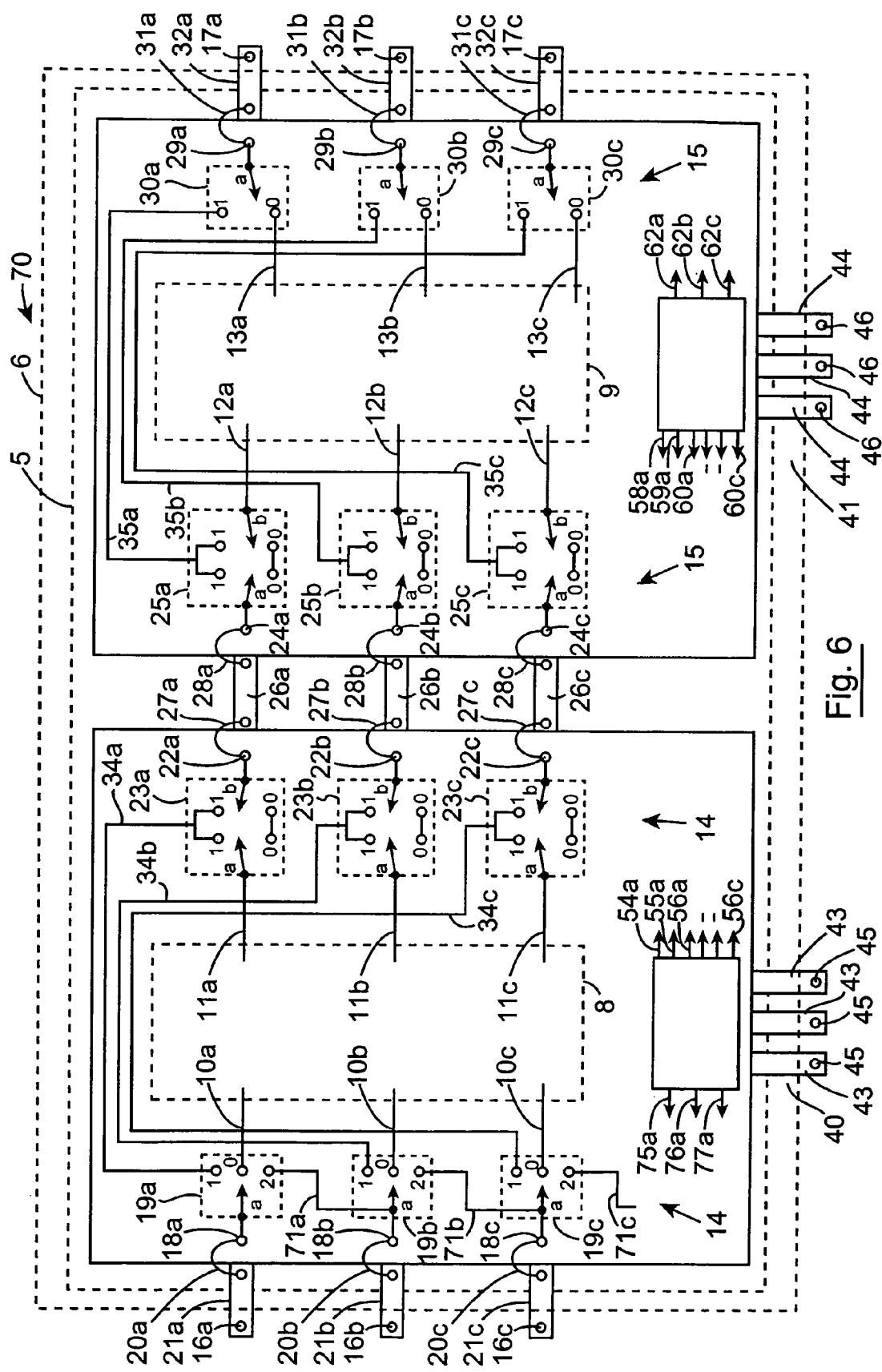
FIG. 6 is a block representation of another integrated circuit package also according to the invention.

Referring now to FIG. 6, there is illustrated an integrated circuit package according to another embodiment of the invention, indicated generally by the reference numeral 70. The integrated circuit package 70 is substantially similar to the integrated circuit package 1 described with reference to FIGS. 1 to 5, and similar components are identified by the same reference numerals. The main difference between the integrated circuit package 70 and the integrated circuit package 1 is that in this embodiment of the invention the first external terminal 16a is a general purpose I/O terminal, and all tests on the integrated circuit package 70 are carried out by applying appropriate test signals to the I/O terminal 16a. In this embodiment of the invention instead of being two-way switches as in the case of the primary input switches 19 of the integrated circuit package 1, the primary input switches 19 are three-way switches, and the switch contact a of the respective primary input switches 19 may be selectively coupled to the contacts zero, one or two. The contact two of each primary input switch 19 is coupled to the switch contact of the next adjacent primary input switch 19 through a corresponding intermediate electrically conductive track 71. The primary input switch 19a is coupled to the primary input switch 19b by the intermediate electrically conductive track 71a, the primary input switch 19b is coupled to the primary input switch 19c by the intermediate electrically conductive track 71b, and so on. Thus, if it is desired to apply a test signal to the first input terminal 10a, the switch contact a of the primary input switch 19a is switched to the contact zero which in turn is coupled to the first input terminal 10a.

On the other hand, if it is desired to apply a test signal to the first output terminal 11a, the second input terminal 12a or the second output terminal 13a, the switch contact a of the primary input switch 19a is switched to the contact one which is coupled to the corresponding first electrically conductive track 34a. The primary output switch 23a and the secondary input switch 25a and the appropriate secondary output switch 30 are then appropriately configured as described with reference to the integrated circuit package 1.

On the other hand, should it be desired to apply a test signal from the I/O terminal 16a to either the first input terminal 10b or 10c, the switch contact a of the primary input switch 19a is switched to the contact two which is coupled to the intermediate electrically conductive track 71a. Thereafter the primary input switches 19b and 19c are set, depending on whether the test signal applied to the I/O terminal 16a is to be applied to the first input terminal 10b or 10c. If the test signal is to be applied to the first input terminal 10b, the switch contact a of the primary input switch 19b is switched to the contact zero. Otherwise, if the test signal is to be applied to the first input terminal 10c, the switch contact a of the primary input switch 19b is switched to the contact two, and the switch contact a of the primary input switch 19c is switched to the contact zero. The primary output switches 23 and the secondary input and output switches 25 and 30 are then appropriately configured.

It will be readily understood that by appropriately configuring the primary and secondary input and output switches 19, 23, 25 and 30 of the integrated circuit package 70, functions of the digital signal processing circuit 8 and the digital-to-analogue converting circuit 9 between selectable combinations of the first input and output terminals 10 and 11 and selectable combinations of the second input and output terminals 12 and 13 may be tested.

Figure 7:
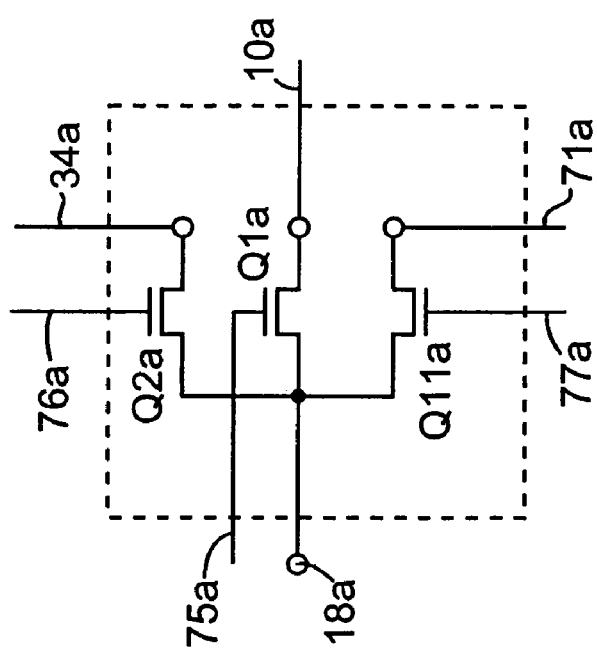
FIG. 7 is a circuit diagram of a detail of the integrated circuit package of FIG. 6.

Referring now to FIG. 7, the first primary input switch 19a of the integrated circuit package 70 is illustrated, and comprises three transistors, namely, a first primary input transistor Q1a, a second primary input transistor Q2a and a third primary input transistor Q11a, all of which are fabricated as CMOS devices on the first die 2. The first primary input transistor Q1a is similar to the first primary input transistor Q1a of the integrated circuit package 1 and couples the first input bond pad 18a with the first input terminal 10a of the digital signal processing circuit 8. The second primary input transistor Q2a is similar to the second primary input transistor Q2a of the integrated circuit package 1, and couples the first input bond pad 18a with the corresponding first electrically conductive track 34a. The third primary input transistor Q11a couples the first input bond pad 18a with the intermediate electrically conductive track 71a for selectively coupling the first input bond pad 18a with the first input bond pad 18b corresponding to the first external terminal 16b. The first, second and third primary input transistors Q1a, Q2a and Q11a are individually controlled by logic signals applied on a first primary control line 75a and first and second intermediate control lines 76a and 77a, respectively, by the first JTAG circuit 38. The first primary input switches 19b and 19c are similar to the first primary input switch 19a, and each comprises a first, second and a third primary input transistor, which are respectively controlled by logic control signals on first control lines 75b and 75c and on first and second intermediate control lines 76b and 76c, and 77b and 77c, respectively, by the first JTAG circuit 38.

Otherwise, the integrated circuit package 70 of FIGS. 6 and 7 is similar to the integrated circuit package 1 described with reference to FIGS. 1 to 5, and its operation is likewise similar, with the exception that all test signals are applied to the I/O terminal 16a. However, on completion of testing, for normal operation of the integrated circuit package 70, the first primary input transistors Q1 of the primary input switches 19 are operated under the control of the first JTAG circuit 38 in the low impedance state, while the second and third primary input transistors Q2 and Q11 of the primary input switches 19 are operated in the high impedance state under the control of the first JTAG circuit 38. Additionally, on completion of testing, for normal operation of the integrated circuit package 70, the transistors of the primary output switches 23 and the secondary input switches 25 and the secondary output switches 30 are operated as already described with reference to the integrated circuit package 1 described with reference to FIGS. 1 to 5.

Figure 9:
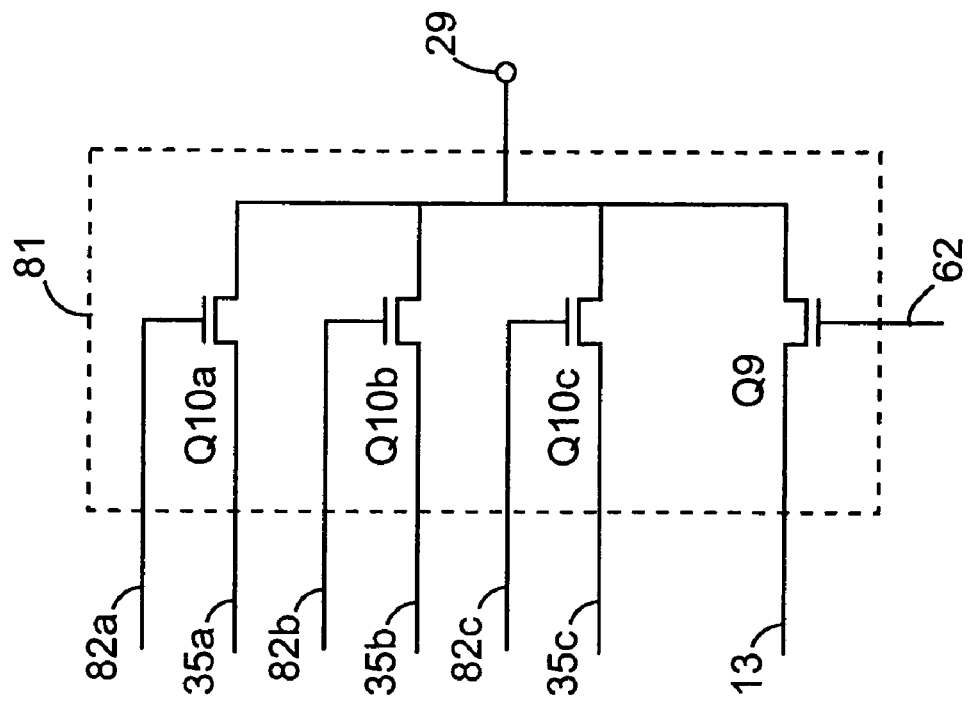
FIG. 9 is a circuit diagram of a detail of the integrated circuit package of FIG. 8.
Figure 8:
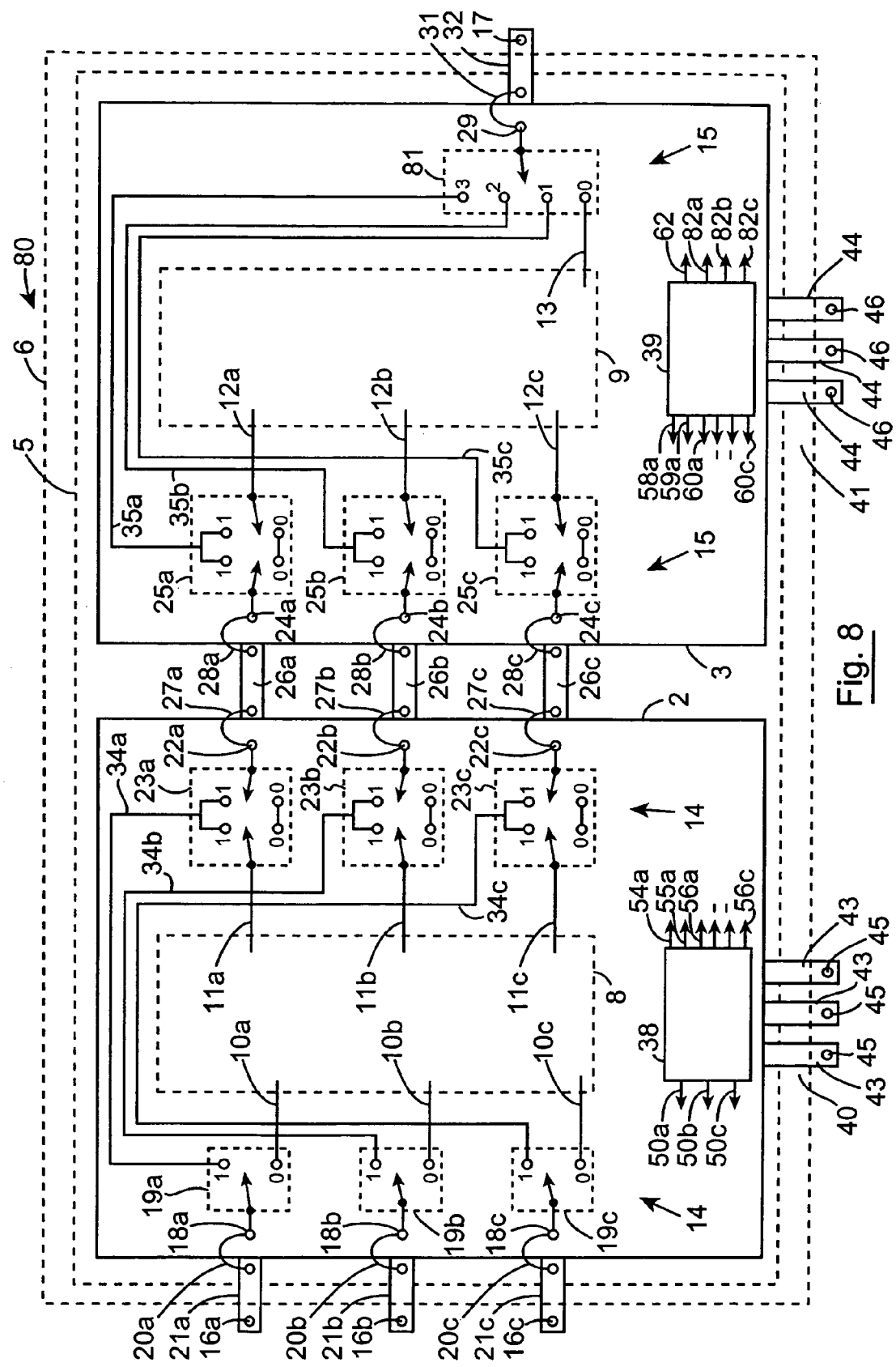
FIG. 8 is a block representation of an integrated circuit package according to another embodiment of the invention.

Referring now to FIGS. 8 and 9, there is illustrated an integrated circuit package according to the invention, indicated generally by the reference numeral 80, according to another embodiment of the invention. The integrated circuit package 80 is substantially similar to the integrated circuit package 1, and similar components are identified by the same reference numerals. The main difference between the integrated circuit package 80 and the integrated circuit package 1 is that in the integrated circuit package 80 only one second external terminal 17 is provided on which an analogue output signal corresponding to a digital input signal applied to the first external terminals 16 is outputted. Additionally, only one single second output terminal 13 is provided from the digital-to-analogue converting circuit 9 of the second die 3. A single second output bond pad 29 is provided on the second die 3, and is coupled by a bond wire 31 to an output track 32 of the laminate 5, which terminates in the single second external terminal 17. In this embodiment of the invention only one secondary output switch 81 is provided for selectively coupling the second output bond pad 29 to the second output terminal 13 of the digital-to-analogue converting circuit 9 for normal operation of the integrated circuit package 80, and to a selected one of the second electrically conductive tracks 35a, 35b and 35c for facilitating testing of the integrated circuit package 80.

Referring now to FIG. 9, the secondary output switch 81 is illustrated. The secondary output switch 81 comprises a first secondary output transistor Q9 which couples the second output bond pad 29 to the second output terminal 13. The first secondary output transistor Q9 of the secondary output switch 81 of the integrated circuit package 80 is similar to the first secondary output transistor Q9 of the secondary output switches 30 of the integrated circuit package 1 described with reference to FIGS. 1 to 5. A plurality of second secondary output transistors Q10a to Q10c are provided for coupling the second output bond pad 29 to the respective second electrically conductive tracks 35a to 35c. Needless to say, it will be appreciated that the number of second secondary output transistors Q10 will depend on the number of second electrically conductive tracks 35. One second secondary output transistor Q10 will be provided for each second electrically conductive track 35. As in the case of the first and second secondary output transistors Q9 and Q10 of the secondary output switches 30 of the integrated circuit package 1, the first and second secondary output transistors Q9 and Q10 of the secondary output switch 81 of the integrated circuit package 80 are fabricated as CMOS devices on the second die 3.

In this embodiment of the invention the first secondary output transistor Q9 is operated under the control of the second JTAG circuit 39 by a logic signal which is applied on a fourth secondary control line 62. Each of the second secondary output transistors Q10a to Q10c are operated under the control of the second JTAG circuit 39 by logic signals applied on corresponding fifth secondary control lines 82a to 82c. The logic control signals are applied on the fourth secondary control line 62 and the fifth secondary control lines 82 so that when one of the first and second secondary output transistors Q9 and Q10 is operated in the low impedance state, the remaining ones of the first and second secondary output transistors Q9 and Q10 are operated in the high impedance state, so that the second output bond pad 29 is only connected to one of the second output terminal 13 and the second electrically conductive tracks 35 at one time, and is isolated from the remaining ones of the second output terminal 13 and the second electrically conductive tracks 35.

In use, operation of the integrated circuit package 80 is substantially similar to the operation of the integrated circuit package 1. During normal use the primary input and output switches 19 and 23 and the secondary input switches 25 are operated as already described. The secondary output switch 81 is operated with the second output bond pad 29 coupled to the second output terminal 13 of the digital-to-analogue converting circuit 9, and isolated from the second electrically conductive tracks 35. During testing of the digital signal processing circuit 8 and the digital-to-analogue converting circuit 9, the primary input and output switches 19 and 23 and the secondary input switches 25 are appropriately operated for testing the function in the selected one of the digital signal processing circuit 8 and the digital-to-analogue converting circuit 9 as already described. If the function to be tested is a function of the digital-to-analogue circuit 9, the secondary output switch 81 is operated for coupling the second output bond pad 29 to the second output terminal 13 of the digital-to-analogue converting circuit 9, and with the primary input and output switches 19 and 23 and the secondary input switches 25 appropriately operated, a test signal is applied to the appropriate one of the first external terminals 16, and an analogue output signal is read from the second external terminal 17.

If the function to be tested is a function of the digital signal processing circuit 8, the secondary output switch 81 is operated for coupling the second output bond pad 29 to the appropriate one of the second electrically conductive tracks 35, and the primary input and output switches 19 and 23 and the secondary input switches 25 are appropriately operated as already described with reference to the integrated circuit package 1.

Otherwise, the integrated circuit package 80 and its operation is similar to that of the integrated circuit package 1.

Figure 10:
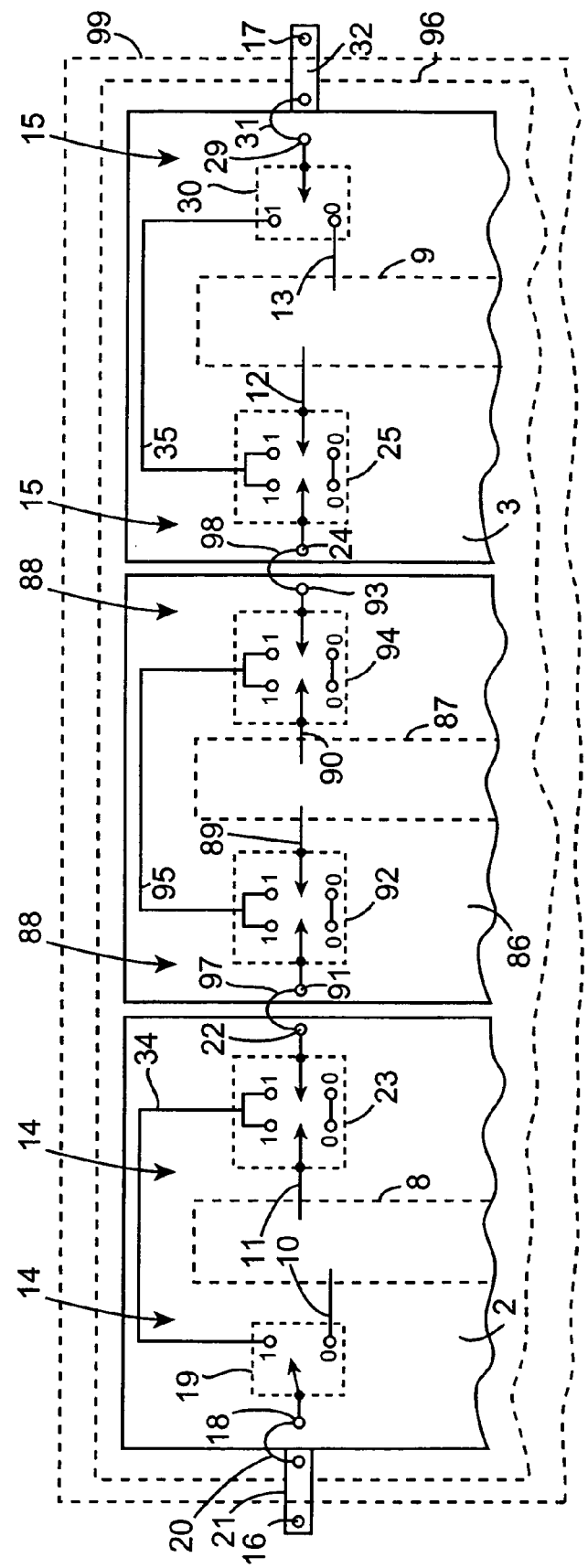
FIG. 10 is a circuit diagram of a portion of an integrated circuit package according to a further embodiment of the invention.

Referring now to FIG. 10, there is illustrated an integrated circuit package according to another embodiment of the invention, indicated generally by the reference numeral 85. The integrated circuit package 85 is substantially similar to the integrated circuit package 1 described with reference to FIGS. 1 to 5 and similar components are identified by the same reference numerals. The main difference between the integrated circuit package 85 and the integrated circuit package 1 is that the integrated circuit package 85 comprises three dies, namely, the first die 2, the second die 3, and an intermediate die 86 comprising an integrated circuit 87, which is coupled between the digital signal processing circuit 8 and the digital-to-analogue converting circuit 9 by the switch circuit. In this embodiment of the invention the switch circuit as well as comprising the first and second integrated switch circuits 14 and 15 on the first and second dies 2 and 3, also comprises an intermediate integrated switch circuit 88, which is formed on the intermediate die 86.

The first and second dies 2 and 3 are identical to the first and second dies 2 and 3 of the integrated circuit package 1, and the digital signal processing circuit 8 of the first die 2 comprises a plurality of first input terminals 10 and first output terminals 11, although only one first input terminal 10 and one first output terminal 11 is illustrated. Each first input terminal 10 of the digital signal processing circuit 8 is coupled to a corresponding first input bond pad 18 through a corresponding primary input switch 19, which in turn is connected to a corresponding first external terminal 16 through a corresponding bond wire 20 and a corresponding track 21 of the laminate 5. The coupling of each first output terminal 11 to the corresponding first output bond pad 22 through the corresponding primary output switch 23 is similar to that of the coupling of each first output terminal 11 to the corresponding first output bond pad 22 of the first die 2 of the integrated circuit package 1, as is the coupling of the corresponding primary input and output switches 19 and 23 through the first electrically conductive tracks 34 on the first die 2. Similarly, the coupling of each second input terminal 12 to the digital-to-analogue converting circuit 9 of the second die 3 to the corresponding second input bond pad 24 through the corresponding secondary input switch 25 is similar to the coupling of the second input terminals 12 to the second input bond pads 24 of the second die 3 of the integrated circuit package 1, as is the coupling of each second output terminal 13 of the digital-to-analogue converting circuit 9 to the corresponding second output bond pad 31 through the corresponding secondary output switch 30. Similarly, the coupling of the corresponding secondary input and output switches 25 and 30 through the corresponding second electrically conductive tracks 35 is similar to that of the integrated circuit package 1.

Turning now to the intermediate die 86, the integrated circuit 87 of the intermediate die 86 may be any type of integrated circuit, for example, a digital or an analogue integrated circuit. However, typically, the integrated circuit 87 of the intermediate die 86 would be a digital signal processing circuit or possibly a memory circuit. A plurality of input terminals 89, only one of which is illustrated, are provided to the integrated circuit 87, and a plurality of output terminals 90, only one of which is illustrated, are provided from the integrated circuit 87. Each input terminal 89 is selectively coupled to a corresponding input bond pad 91 by a corresponding intermediate input switch 92 of the intermediate switch circuit 88. Each intermediate input switch 92 is similar to the secondary input switches 25 of the second die 2 and comprises transistors similar to the transistors Q6, Q7 and Q8 of FIG. 4, which are fabricated on the intermediate die 86. Each output terminal 90 of the integrated circuit 87 is selectively coupled to a corresponding output bond pad 93 by a corresponding intermediate output switch 94 of the intermediate switch circuit 88. Each intermediate output switch 94 is similar to the primary output switches 23 of the first die 2 and comprises transistors which are similar to the transistors Q3, Q4 and Q5 as illustrated in FIG. 3, and which are fabricated on the intermediate die 86.

Each intermediate input switch 92 is coupled to a corresponding one of the intermediate output switches 94 by an intermediate electrically conductive track 95. The intermediate electrically conductive tracks 95 are similar to the first and second electrically conductive tracks 34 and 35.

The first and second dies 2 and 3 and the intermediate die 86 are mounted on a laminate 96, which is substantially similar to the laminate 5 of the integrated circuit package 1, and are effectively coupled in series. Each input bond pad 91 is coupled to a corresponding first output bond pad 22 of the first die 2 by a corresponding bond wire 97, and each output bond pad 93 is coupled to a corresponding one of the second input bond pads 24 of the second die 3 by a corresponding bond wire 98. Although, if desired, each input bond pad 91 of the intermediate die 86 could be coupled to the first output bond pad 22 of the first die 2 through a corresponding track of the laminate 96, and similarly, each output bond pad 93 of the intermediate die 86 could be coupled to the second input bond pad 24 of the second die 3 through a corresponding track of the laminate 96, in a similar manner as the first output bond pads 22 are coupled to the corresponding second input bond pads 24 of the integrated circuit package 1.

The first and second dies 2 and 3 and the intermediate die 86 are encapsulated together on and with the laminate 96 in a resin encapsulating housing 99. The first and second external terminals 16 and 17 are similarly formed by hemispherical solder contacts on an exposed under surface of the laminate 96, as in the case of the integrated circuit package 1.

Although not illustrated, a control circuit is provided on the intermediate die 87 and is provided by a JTAG circuit, similar to the JTAG circuits 38 and 39 of the first and second dies 2 and 3 for controlling the operation of the transistors of the intermediate input and output switches 92 and 94 for in turn operating the intermediate input and output switches 92 and 94.

In use, the primary input and output switches 19 and 23 and the secondary input and output switches 25 and 30 are operated as already described with reference to the integrated circuit package 1 for normal operation of the integrated circuit package 85. Additionally, in normal operation of the integrated circuit package 85, the intermediate input and output switches 92 and 94 are operated so that each input terminal 89 of the integrated circuit 87 is coupled to the corresponding input bond pad 91, and each output terminal 90 of the integrated circuit 87 is coupled to the corresponding output bond pad 93. Testing of functions of the digital signal processing circuit 8 and the digital-to-analogue converting circuit 9 between selected pairs of first input and output terminals 10 and 11 and second input and output terminals 12 and 13 is similar to that already described with reference to the integrated circuit package 1, with the addition that the appropriate intermediate input switch 92 and the appropriate intermediate output switch 94 are operated for coupling the appropriate one of the first output bond pads 22 to the appropriate one of the second input bond pads 24 through the appropriate intermediate electrically conductive track 95.

In order to test a function of the intermediate circuit 87 between a selected pair of input and output terminals 89 and 90, the intermediate input switch 92 corresponding to the selected input terminal 89 is operated for coupling the selected input terminal 89 to the corresponding input bond pad 91, and the intermediate output switch 94 corresponding to the selected output terminal 90 is operated for coupling the selected output terminal 90 to the corresponding output bond pad 93. The appropriate ones of the primary input and output switches 19 and 23 are operated for coupling the appropriate first external terminal 16 directly to the input bond pad 91 corresponding to the selected input terminal 89 through the corresponding first electrically conductive track 34. The appropriate ones of the secondary input and output switches 25 and 30 are operated for coupling the output bond pad 93 corresponding to the selected output terminal 90 directly to the appropriate one of the second external terminals 17 through the corresponding second electrically conductive track 35. A suitable test signal is then applied to the appropriate first external terminal 16, and a response signal is read from the appropriate second external terminal 17.

Otherwise, the integrated circuit package 85 is similar to the integrated circuit package 1 and its operation is otherwise similar.

While the integrated circuit package 85 has been described as comprising one intermediate die which is effectively connected in series between the first and second dies 2 and 3, it is envisaged that a plurality of intermediate dies may be provided, and where a plurality of intermediate dies are provided between the first and second dies, the integrated circuits of the respective intermediate dies may be coupled in series between the first and second integrated circuits of the first and second dies, or may be coupled in parallel with each other between the first and second integrated circuits of the first and second dies, or some of the integrated circuits of the intermediate dies may be coupled in series, while others would be coupled in parallel with each other.

While many of the integrated circuit packages according to the invention have been described as comprising the same number of second external terminals 17 as first external terminals 16, it will be readily understood by those skilled in the art that the number of second external terminals 17 may be different to the number of first external terminals 16, and in general will be different. It is also envisaged that while the digital signal processing circuit has been described as comprising the same number of first output terminals as first input terminals, it will be readily understood by those skilled in the art that the number of first output terminals may be different to the number of first input terminals, however, it is envisaged that in general the number of second input terminals to the digital-to-analogue converting circuit 9 will be similar to the number of first output terminals from the digital signal processing circuit 8.

While in the integrated circuit package 1 described with reference to FIGS. 1 to 5 each first external terminal 16 is adapted for receiving a test signal, and while in the integrated circuit package 70 described with reference to FIGS. 6 and 7 only one of the first external terminals 16, namely, the first external terminal 16a has been described as being suitable for applying test signals to the integrated circuit package, it will be readily apparent to those skilled in the art that the first input terminals of the digital signal processing circuit 8 may be grouped in groups of first input terminals, and a corresponding first external terminal would be provided for each first input terminal, and in such a case only one of the first external terminals 16 of each group would be adapted for applying test signals to the respective groups of first input terminals to the digital signal processing circuit 8.

While the first and second control circuits have been described as being JTAG circuits, any other suitable control circuits may be provided for controlling operation of the primary input and output switches and the secondary input and output switches of the first and second dies and the intermediate input and output switches of the intermediate dies. Needless to say, other suitable construction and arrangement of first and second switch circuits and intermediate switch circuit may be provided for facilitating selectively applying test signals to the first input and output terminals of the digital signal processing circuit and the second input and output terminals and of the digital-to-analogue converting circuit, and to the input and output terminals of the integrated circuits of the intermediate dies.

While the integrated circuit packages have been described with the first and second dies, and the intermediate die or dies, as the case may be, lying side by side on the laminate, it is envisaged in many cases that the dies will be stacked one above the other on the laminate. It is also envisaged that instead of mounting the dies on a laminate, the dies may be mounted on a lead frame, or any other suitable support.

It will also be appreciated that all the dies of the integrated circuit packages may comprise digital signal processing circuits, or alternatively, all the dies may comprise analogue signal processing circuits, and in other embodiments of the invention it is envisaged that the first die may comprise an analogue signal processing circuit, and the second die may comprise a digital signal processing circuit. Indeed, where the first die comprises an analogue circuit it is envisaged that only one external terminal may be provided for the analogue circuit.

While in the integrated circuit packages described with reference to the drawings, a description of the provision of external terminals for providing power supplies, clock signals and other such signals to the integrated circuits of the dies has been omitted, it will be readily apparent to those skilled in the art that other appropriate external terminals will be provided where required.

While the first and second integrated circuits on the first and second dies of the integrated circuit packages have been described as being a digital signal processing circuit, and a digital-to-analogue converting circuit, respectively, any other integrated circuits could be provided on the first and second dies. The first and second integrated circuits have been described as being a digital signal processing circuit and a digital-to-analogue converting circuit, solely for the purpose of illustration.

The invention claimed is:

1. An integrated circuit package comprising:
   a first die having a first integrated circuit thereon, and a first input terminal to and a first output terminal from the first integrated circuit,
   a second die having a second integrated circuit thereon, and a second input terminal to and a second output terminal from the second integrated circuit,
   a first external terminal accessible externally of the integrated circuit package,
   a second external terminal accessible externally of the integrated circuit package, and
   a switch circuit operable for selectively coupling the first input terminal to the first external terminal, the second output terminal to the second external terminal, and the first and second dies in such a way that the first die precedes the second die in a signal path for normal operation of the integrated circuit package, the switch circuit being selectively operable to facilitate testing of the first integrated circuit such that a test signal applied to the first external terminal is relayed to the first input terminal and a response signal on the first output terminal is relayed to the second external terminal, and the switch circuit being selectively operable to facilitate testing of the second integrated circuit such that a test signal applied to the first external terminal is relayed to the second input terminal and a response signal on the second output terminal is relayed to the second external terminal.

2. An integrated circuit package as claimed in claim 1 in which the switch circuit is operable for selectively coupling the first external terminal to the first output terminal.

3. An integrated circuit package as claimed in claim 1 in which the switch circuit is further operable for selectively coupling the second external terminal to the second input terminal.

4. An integrated circuit package as claimed in claim 1 in which a plurality of first output terminals are provided from the first integrated circuit, and a plurality of second input terminals are provided to the second integrated circuit, the switch circuit being operable for selectively coupling the second input terminals to respective corresponding ones of the first output terminals for normal operation of the integrated circuit package.

5. An integrated circuit package as claimed in claim 4 in which the switch circuit is operable for selectively coupling the first external terminal to a selected one of selectable ones of at least some of the second input terminals.

6. An integrated circuit package as claimed in claim 4 in which the switch circuit is operable for selectively coupling the first external terminal to a selected one of selectable ones of at least some of the first output terminals.

7. An integrated circuit package as claimed in claim 4 in which the switch circuit is operable for selectively coupling the second external terminal to a selected one of selectable ones of at least some of the first output terminals.

8. An integrated circuit package as claimed in claim 1 in which a plurality of first input terminals are provided to the first integrated circuit, and the switch circuit is operable for selectively coupling the first external terminal to a selected one of selectable ones of at least some of the first input terminals.

9. An integrated circuit package as claimed in claim 8 in which a plurality of externally accessible first external terminals are provided, at least some of the first external terminals corresponding to respective ones of the first input terminals, and the switch circuit is operable for selectively coupling the first external terminals to the corresponding first input terminals for normal operation of the integrated circuit package.

10. An integrated circuit package as claimed in claim 9 in which at least one of the first external terminals corresponds to a plurality of the first input terminals, and the switch circuit is operable for selectively coupling a selected one of selectable ones of the plurality of first input terminals corresponding to the at least one of the first external terminals to the corresponding first external terminal.

11. An integrated circuit package as claimed in claim 1 in which a plurality of second output terminals are provided from the second integrated circuit, and the switch circuit is operable for selectively coupling the second external terminal to a selected one of selectable ones of the second output terminals.

12. An integrated circuit package as claimed in claim 11 in which a plurality of externally accessible second external terminals are provided, at least some of the second external terminals corresponding to respective ones of the second output terminals, and the switch circuit is operable for selectively coupling the second external terminals to the corresponding second output terminals for normal operation of the integrated circuit package.

13. An integrated circuit package as claimed in claim 1 in which at least one intermediate die is provided, the intermediate die having an integrated circuit thereon and an input terminal to and an output terminal from the integrated circuit, the switch circuit being operable for selectively coupling the second input terminal of the second integrated circuit of the second die to the first output terminal of the first integrated circuit of the first die through the integrated circuit of the at least one intermediate die for normal operation of the integrated circuit package, and the switch circuit being operable for facilitating selective testing of the integrated circuit of the intermediate die, so that a test signal applied to the first external terminal is relayed to the input terminal of the integrated circuit of the intermediate die and a response signal to the test signal on the output terminal of the integrated circuit of the intermediate die is relayed to the second external terminal.

14. An integrated circuit package as claimed in claim 13 in which a plurality of intermediate dies is provided, each intermediate die having an integrated circuit thereon and an input terminal to and an output terminal from the integrated circuit, the switch circuit being operable for selectively coupling the second input terminal of the second integrated circuit of the second die to the first output terminal of the first integrated circuit of the first die through the integrated circuits of at least some of the intermediate dies for normal operation of the integrated circuit package, and the switch circuit being operable for selectively testing the integrated circuit of a selected one of the intermediate dies, so that a test signal applied to the first external terminal is relayed to the input terminal of the integrated circuit of the selected intermediate die, and a response signal to the test signal on the output terminal of the integrated circuit of the selected intermediate die is relayed to the second external terminal.

15. An integrated circuit package as claimed in claim 1 in which a first input bond pad corresponding to each first external terminal is provided on the first die, each first input bond pad being coupled to the corresponding first external terminal, and being selectively coupleable to a selected one of selectable ones of the corresponding one or ones of the first input terminals, the corresponding one or ones of the first output terminals and the corresponding one or ones of the second input terminals by the switch circuit.

16. An integrated circuit package as claimed in claim 15 in which a first output bond pad corresponding to each first output terminal is provided on the first die, each first output bond pad being selectively coupleable to a selected one of the corresponding first output terminal and the corresponding first input bond pad by the switch circuit.

17. An integrated circuit package as claimed in claim 16 in which a second input bond pad corresponding to each second input terminal is provided on the second die, each second input bond pad being coupled to the corresponding first output bond pad, and being selectively coupleable to a selected one of the corresponding second input terminal and the second external terminal by the switch circuit.

18. An integrated circuit package as claimed in claim 17 in which a second output bond pad corresponding to each second external terminal is provided on the second die, each second output bond pad being coupled to the corresponding second external terminal, and being selectively coupleable to a selected one of the corresponding second output terminal and the second input bond pad by the switch circuit.

19. An integrated circuit package as claimed in claim 1 in which the switch circuit comprises a first switch circuit and a second switch circuit, the first switch circuit being implemented as a first integrated switch circuit on the first die, and the second switch circuit being implemented as a second integrated switch circuit on the second die.

20. An integrated circuit package as claimed in claim 13 in which the switch circuit comprises an intermediate switch circuit implemented as an integrated circuit on each intermediate die.

21. An integrated circuit package as claimed in claim 1 in which a control circuit responsive to an externally generated signal applied thereto is provided for selectively operating the switch circuit.

22. An integrated circuit package as claimed in claim 21 in which the control circuit is implemented as an integrated circuit on at least one of the first and second dies.

23. An integrated circuit package as claimed in claim 1 in which the first and second dies are mounted on a support and encapsulated with the support, the first and second external terminals extending out of the encapsulation.

24. An integrated circuit package comprising:
  a first die having a first integrated circuit thereon, and at least one first input terminal to and a plurality of first output terminals from the first integrated circuit,
  a second die having a second integrated circuit thereon and a plurality of second input terminals to and at least one second output terminal from the second integrated circuit, at least one first external terminal accessible externally of the integrated circuit package, at least one second external terminal accessible externally of the integrated circuit package, and a switch circuit operable for selectively coupling the or each first external terminal to the one or a corresponding one of the first input terminals, the or each second external terminal to the one or a corresponding one of the second output terminals, and each second input terminal to a corresponding one of the first output terminals for normal operation of the integrated circuit package, the switch circuit being operable for facilitating selective testing of the first and second integrated circuits between selectable combinations of the first input terminal or terminals and the first output terminals and selectable combinations of the second input terminals and the second output terminal or terminals, so that when the first integrated circuit is being tested a test signal applied to the one or one of the first external terminals is relayed to the first input terminals of the first integrated circuit, and a response signal to the test signal on a selected one of the first output terminals of the first integrated circuit is relayed to the one or one of the second external terminals, and when the second integrated circuit is being tested a test signal applied to the one or one of the first external terminals is relayed to the second input terminals of the second integrated circuit and a response signal to the test signal on a selected one of the second output terminals of the second integrated circuit is relayed to one or more of the second external terminals.

25. An integrated circuit package as claimed in claim 24 in which at least one intermediate die is provided, the intermediate die having an integrated circuit thereon and a plurality of input terminals to and at least one output terminal from the integrated circuit, the switch circuit being operable for selectively coupling the second input terminal of the second integrated circuit of the second die to the first output terminal of the first integrated circuit of the first die through the integrated circuit of the at least one intermediate die for normal operation of the integrated circuit package, and the switch circuit being operable for facilitating selective testing of the integrated circuit of one of the at least one intermediate die between selectable combinations of the input and output terminals of the integrated circuit of the selected one of the at least one of the intermediate die so that a test signal applied to one or one of the first external terminals is relayed to a selected one of the input terminals of the integrated circuit of the selected intermediate die, and a response signal to the test signal on the output terminal or the selected one of the output terminals of the integrated circuit of the selected intermediate die is relayed to the second external terminal.

26. A method for producing an integrated circuit package comprising two dies with respective integrated circuits formed thereon, and with input and output terminals of the integrated circuits being directly addressable for facilitating testing of the integrated circuits, the method comprising:

providing a first die of the two dies, the first die having a first integrated circuit thereon with a first input terminal to and a first output terminal from the first integrated circuit, providing a second die of the two dies, the second die having a second integrated circuit thereon with a second input terminal to and a second output terminal from the second integrated circuit, providing a first external terminal accessible externally of the integrated circuit package, providing a second external terminal accessible externally of the integrated circuit package, and providing a switch circuit operable for selectively coupling the first input terminal to the first external terminal, the second output terminal to the second external terminal, and the second input terminal to the first output terminal for normal operation of the integrated circuit package, the switch circuit being operable for facilitating selective testing of the first and second integrated circuits, when the first integrated circuit is being tested a test signal applied to the first external terminal is relayed to the first input terminal of the first integrated circuit and a response signal from the first output terminal of the first integrated circuit is relayed to the second external terminal; and when the second integrated circuit is being tested a test signal applied to the first external terminal is relayed to the second input terminal of the second integrated circuit and a response signal from the second output terminal of the second integrated circuit is relayed to the second external terminal.

27. A method for producing an integrated circuit package comprising two dies with respective integrated circuits formed thereon, and with input and output terminals of the integrated circuits being directly addressable for facilitating testing of the integrated circuits, the method comprising:

providing a first die of the two dies, the first die having a first integrated circuit thereon with at least one first input terminal to and a plurality of first output terminals from the first integrated circuit, providing a second die having a second integrated circuit thereon with a plurality of second input terminals to and at least one second output terminal from the second integrated circuit, providing at least one first external terminal accessible externally of the integrated circuit package, providing at least one second external terminal accessible externally of the integrated circuit package, and providing a switch circuit operable for selectively coupling the or each first external terminal to the one or to a corresponding one of the first input terminals, the or each second external terminal to the one or a corresponding one of the second output terminals, and each second input terminal to a corresponding one of the first output terminals for normal operation of the integrated circuit package, the switch circuit being operable for facilitating selective testing of the first and second integrated circuits between selectable combinations of the first input terminal or terminals and the first output terminals and selectable combinations of the second input terminals and the second output terminal or terminals, when the first integrated circuit is being tested, a test signal applied to the one or more of the first external terminals is relayed to the first input terminal and a response signal on the first output terminal or one of the first output terminals is relayed to the at least one second external terminal; and when the second integrated circuit is being tested a test signal applied to the one or one of the first external terminals is relayed to one or ones of the plurality of second input terminals and a response signal on the at least one second output terminal is relayed to the at least one second external terminal.

28. An integrated circuit package comprising:

a first die having a first integrated circuit thereon, and a first input terminal to and a first output terminal from the first integrated circuit, a second die having a second integrated circuit thereon, and a second input terminal to and a second output terminal from the second integrated circuit, a first external terminal accessible externally of the integrated circuit package, a second external terminal accessible externally of the integrated circuit package, at least one intermediate die, the intermediate die having an integrated circuit thereon and an input terminal to and an output terminal from the integrated circuit, and a switch circuit operable for selectively coupling the first input terminal to the first external terminal, the second output terminal to the second external terminal, and the second input terminal to the first output terminal of the first die through the integrated circuit of the at least one intermediate die for normal operation of the integrated circuit package, the switch circuit being operable for facilitating selective testing of the first and second integrated circuits, so that a test signal applied to the first external terminal is relayed to the one of the first and second input terminals of the selected one of the first and second integrated circuits, and a response signal to the test signal on the one of the first and second output terminals of the selected one of the first and second integrated circuits is relayed to the second external terminal, the switch circuit being operable for facilitating selective testing of the integrated circuit of the intermediate die, so that a test signal applied to the first external terminal is relayed to the input terminal of the integrated circuit of the intermediate die and a response signal to the test signal on the output terminal of the integrated circuit of the intermediate die is relayed to the second external terminal.

29. An integrated circuit package as claimed in claim 28, in which a plurality of intermediate dies is provided, each intermediate die having an integrated circuit thereon and an input terminal to and an output terminal from the integrated circuit, the switch circuit being operable for selectively coupling the second input terminal of the second integrated circuit of the second die to the first output terminal of the first integrated circuit of the first die through the integrated circuits of at least some of the intermediate dies for normal operation of the integrated circuit package, and the switch circuit being operable for selectively testing the integrated circuit of a selected one of the intermediate dies, so that a test signal applied to the first external terminal is relayed to the input terminal of the integrated circuit of the selected intermediate die, and a response signal to the test signal on the output terminal of the integrated circuit of the selected intermediate die is relayed to the second external terminal.

* * * * *